(12) United States Patent
Nishizawa et al.

(10) Patent No.: US 6,972,644 B2
(45) Date of Patent: Dec. 6, 2005

(54) SURFACE ACOUSTIC WAVE LADDER FILTER DEVICE HAVING RESONATORS WITH DIFFERENT ELECTRODE PITCHES AND ELECTROSTATIC CAPACITANCES

(75) Inventors: Toshio Nishizawa, Yokohama (JP); Tomoka Hattanda, Yokohama (JP)

(73) Assignee: Fujitsu Media Devices Limited, Kanagawa (JP)

( * ) Notice: Subject to any disclaimer, the term of this patent is extended or adjusted under 35 U.S.C. 154(b) by 0 days.

(21) Appl. No.: 10/923,813

(22) Filed: Aug. 24, 2004

(65) Prior Publication Data

US 2005/0046520 A1 Mar. 3, 2005

Related U.S. Application Data

(63) Continuation of application No. PCT/JP03/01165, filed on Feb. 5, 2003.

(30) Foreign Application Priority Data

Feb. 25, 2002 (JP) .............................. 2002-048678

(51) Int. Cl.$^7$ .............................................. H03H 9/64
(52) U.S. Cl. ................................. 333/195; 310/313 D
(58) Field of Search ................................ 333/193–196; 310/313 R, 313 B, 313 C, 313 D (56) References Cited

U.S. PATENT DOCUMENTS

| | | | | |
|---|---|---|---|---|
| 5,638,036 A | * | 6/1997 | Penunuri et al. | 333/194 |
| 5,831,493 A | * | 11/1998 | Ushiroku | 333/193 |
| 6,031,435 A | * | 2/2000 | Inose et al. | 333/193 |
| 6,137,380 A | * | 10/2000 | Ushiroku et al. | 333/193 |
| 6,201,457 B1 | * | 3/2001 | Hickernell | 333/193 |
| 6,255,916 B1 | * | 7/2001 | Nakamura et al. | 333/195 |
| 6,351,197 B1 | * | 2/2002 | Selmeier et al. | 333/195 |
| 6,480,075 B1 | * | 11/2002 | Fujita et al. | 333/193 |
| 6,570,470 B2 | * | 5/2003 | Maehara et al. | 333/193 |

FOREIGN PATENT DOCUMENTS

| | | |
|---|---|---|
| EP | 0 652 637 A1 | 5/1995 |
| EP | 0 874 457 A2 | 10/1998 |
| EP | 0 928 064 A2 | 7/1999 |
| EP | 0 995 265 A1 | 4/2000 |
| JP | 6-338756 | * 12/1994 |
| JP | 9-55640 | * 2/1997 |
| JP | 10-242799 | * 9/1998 |
| JP | 2000-341086 | 12/2000 |
| JP | 2001-308676 | 11/2001 |
| WO | 99/04490 WO A1 | 1/1999 |

* cited by examiner

Primary Examiner—Barbara Summons
(74) Attorney, Agent, or Firm—Arent Fox PLLC (57) ABSTRACT

A surface acoustic wave device that has surface acoustic wave resonators connected in a multi-stage ladder arrangement, includes: two or more different pitches of comb-like drive electrodes of parallel-arm resonators (P1~P3) and two or more different pitches of comb-like drive electrodes of series-arm resonators (S1~S3); reflection electrodes (12, 14) placed at either side of a comb-like drive electrode having a pitch different from that of said comb-like drive electrode; and two or more different electrostatic capacitances of parallel-arm resonators and two or more different electrostatic capacitances of series-arm resonators.

6 Claims, 13 Drawing Sheets

SURFACE ACOUSTIC WAVE LADDER FILTER DEVICE HAVING RESONATORS WITH DIFFERENT ELECTRODE PITCHES AND ELECTROSTATIC CAPACITANCES

CROSS-REFERENCE TO RELATED APPLICATION

This application is a continuation of Application No. PCT/JP03/01165, filed Feb. 5, 2003, the entire specification claims and drawings of which are incorporated herewith by reference.

FIELD OF THE INVENTION

The present invention relates to surface acoustic wave devices, and more particularly, to a surface acoustic wave device that has surface acoustic wave resonators connected in a multi-stage ladder arrangement.

In recent years, wireless devices such as portable telephone devices have been rapidly becoming smaller and sophisticated. Filters that are used in the high frequency circuits of those wireless devices play important roles in this development. Especially, surface acoustic wave devices are used to embody such filters.

BACKGROUND OF THE INVENTION

Figure 1:
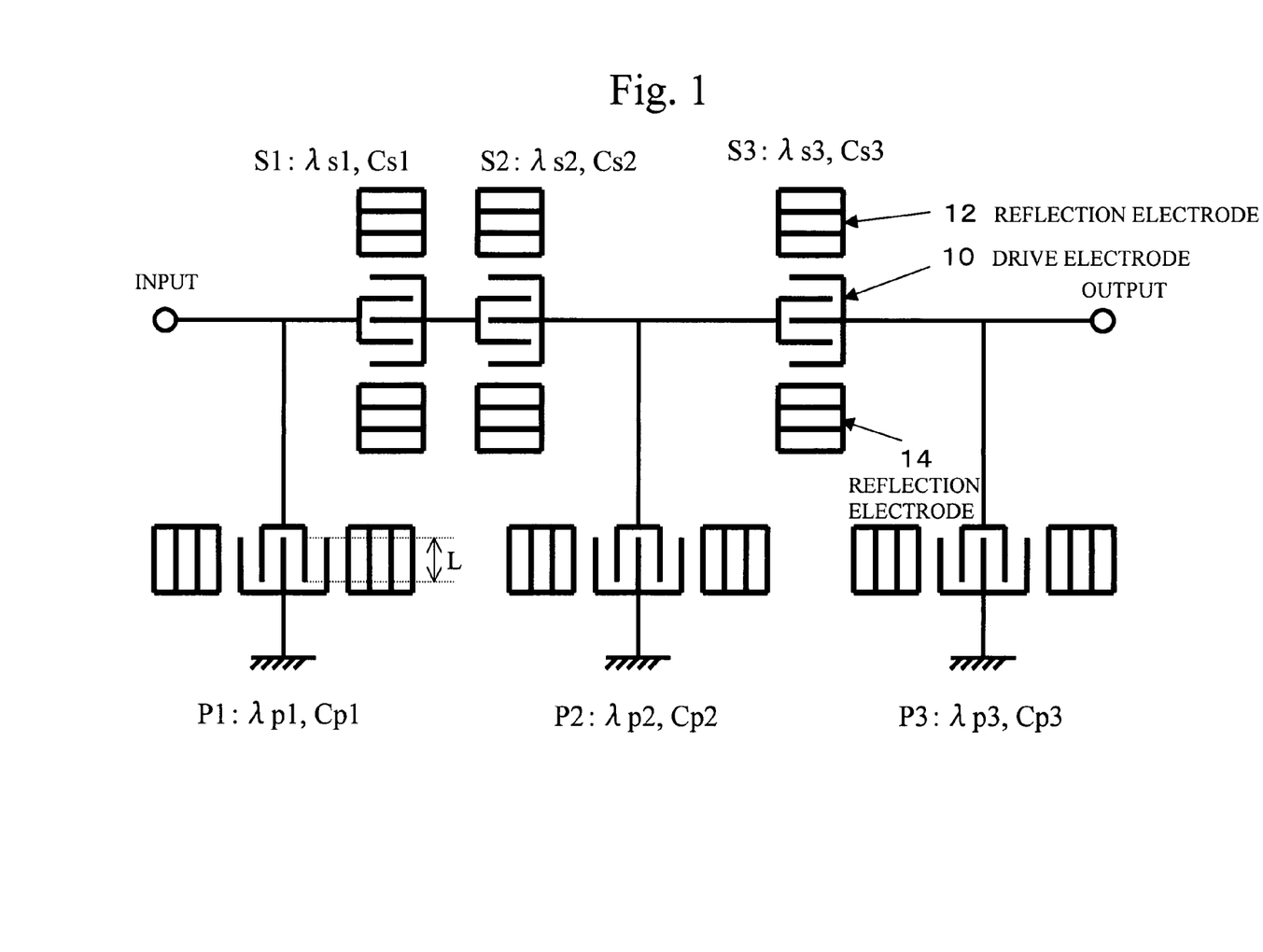
FIG. 1 illustrates an example structure of a surface acoustic wave device.

FIG. 1 schematically illustrates a surface acoustic wave device that has surface acoustic wave resonators connected in a multi-stage ladder arrangement. The surface acoustic wave device shown in FIG. 1 is a filter with a four-stage structure, and includes three surface acoustic wave resonators S1, S2, and S3 that are arranged in a series arm (hereinafter referred to as the series-arm resonators S1, S2, and S3), and three surface acoustic wave resonator P1, P2, and P3 that are arranged in parallel arms (hereinafter referred to as the parallel-arm resonators P1, P2, and P3). The parallel-arm resonator P2 is shared between the second and third stages, and the series-arm resonator S3 is shared between the third and fourth stages. Each resonator includes a drive electrode 10 and two reflection electrodes 12 and 14 that are placed on both sides of the drive electrode 10. For convenience, reference numerals for those components are shown only for the series-arm resonator S3 in FIG. 1. The reflection electrodes 12 and 14 function to confine surface acoustic wave propagated from the drive electrode 10. The drive electrode 10 and the reflection electrode 12 and 14 are formed on a plate-like piezoelectric member. The drive electrode 10 of this type is called an interdigital transducer (IDT), a comb-like electrode, a comb-like drive electrode, or a blind-like electrode. In this description, each drive electrode will be hereinafter referred to as a comb-like drive electrode.

In the conventional surface acoustic wave device having surface acoustic wave resonators connected in a multi-stage ladder arrangement as shown in FIG. 1, the relationship among the comb-like drive electrode pitches (hereinafter also referred to as the IDT pitches) $\lambda_{P1}$, $\lambda_{P2}$, and $\lambda_{P3}$ of the parallel-arm resonators P1 through P3, and the relationship among the IDT pitches $\lambda_{S1}$, $\lambda_{S2}$, and $\lambda_{S3}$ of the series-arm resonators S1 through S3 are expressed as $\lambda_{P1}=\lambda_{P2}=\lambda_{P3}$ and $\lambda_{S1}=\lambda_{S2}=\lambda_{S3}$, respectively. Also, the relationship among the electrostatic capacitances $C_{P1}$, $C_{P2}$, and $C_{P3}$ of the parallel-arm resonators P1 through P3, and the relationship among the electrostatic capacitances $C_{S1}$, $C_{S2}$, and $C_{S3}$ of the series-arm resonators S1 through S3 are expressed as $C_{P1}=C_{P2}/2=C_{P3}$ and $C_{S1}=C_{S2}=2C_{S3}$, respectively. Here, each electrostatic capacitance C [F] is expressed as $C=4\times10^{-14}\times L/100\times N$, where the aperture length is L [$\mu$m] and the number of drive electrode finger pairs is N [pairs].

Figure 2:
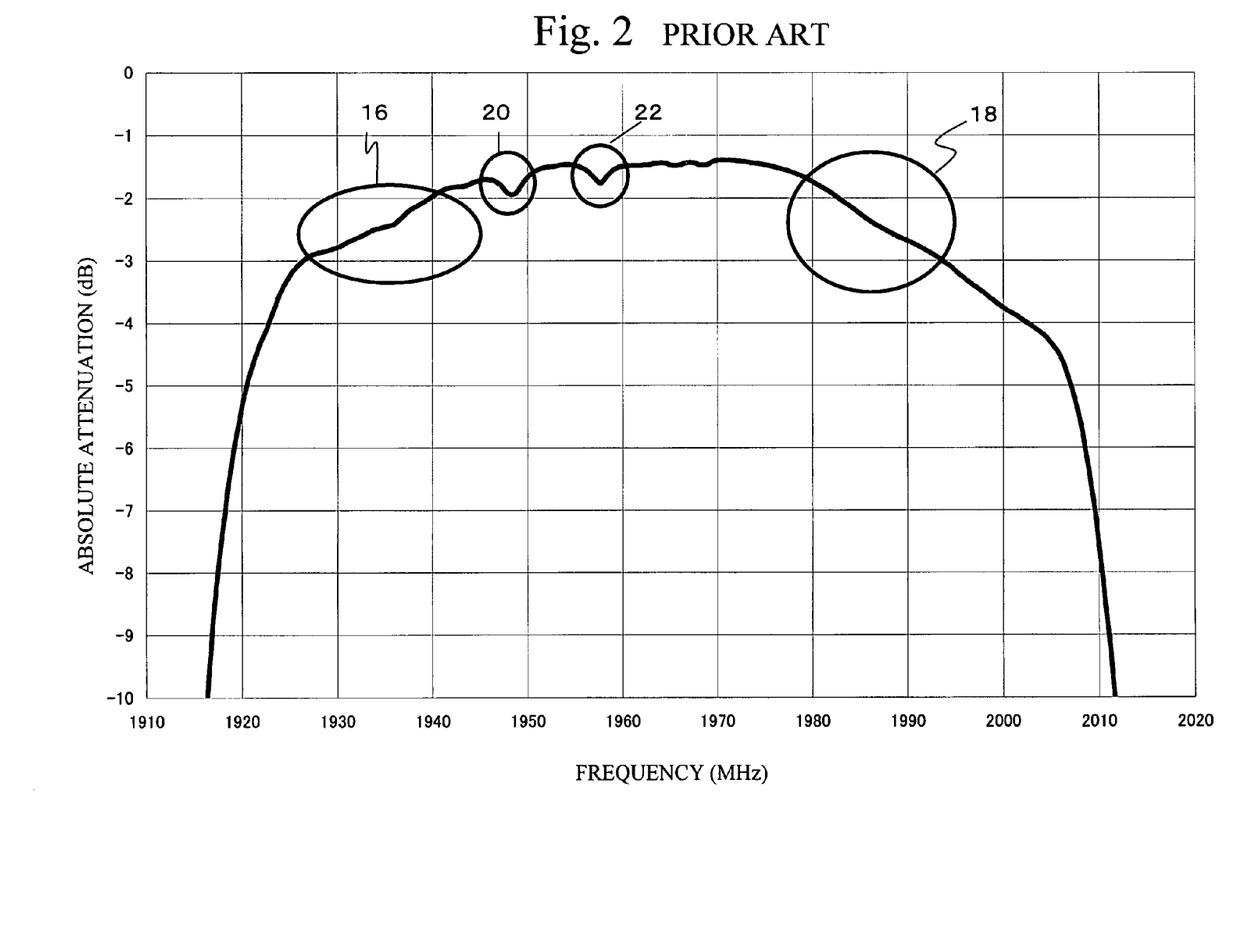
FIG. 2 shows the filter characteristics obtained with a conventional design.

FIG. 2 shows the filter characteristics obtained with the conventional design. In FIG. 2, the abscissa axis indicates frequency (MHz), and the ordinate axis indicates absolute attenuation (dB).

In a ladder filter, loss can be easily restricted to a low amount. In the conventional design, however, as can be seen from FIG. 2, the insertion loss (denoted by reference numerals 16 and 18) on the low frequency side (or the high frequency side) of the pass band is much greater than the insertion loss in the vicinity of the center frequency, and small spurious peaks (denoted by reference numerals 20 and 22) also appear in the pass band. The increases in insertion loss at the edges of the pass band are considered to be caused by spurious wave due to bulk wave radiation (the wave propagated in the piezoelectric substrate in the vertical direction) in each resonator within the pass band, or by impedance mismatching at the time of the multi-stage connecting process. The increases in insertion loss have hindered improvements in terms of insertion loss and attenuation in the vicinity of the pass band.

For example, Japanese Unexamined Patent Publication No. 2000-341086 discloses a technique for reducing the insertion loss at the edges of the pass band by slightly varying the pitches of the parallel-arm resonators. However, this technique is not effective enough to prevent spurious peaks that are caused by bulk wave radiation of the series-arm resonators and spurious peaks that appear outside the pass band. Japanese Unexamined Patent Publication No. 2001-308676 discloses a technique for improving the shape factor in the pass band characteristics by varying the pitch of the comb-like drive electrode from the pitch of the reflection electrodes. However, this is not effective enough to prevent the increases in insertion loss at the edges of the pass band, either.

Therefore, the object of the present invention is to eliminate the above problems of the prior art, and to improve both the insertion loss characteristics and the shape factor of a surface acoustic wave device having resonators connected in a multi-stage ladder arrangement.

DISCLOSURE OF THE INVENTION

To achieve the above object, the present invention provides a surface acoustic wave device that has surface acoustic wave resonators connected in a multi-stage ladder arrangement, including: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators. With this structure, bulk wave radiation can be scattered, and spurious peaks inside and outside the pass band can also be scattered and reduced. Also, impedance mismatching can be reduced. Furthermore, loss at the edges of the pass band can be reduced, and the insertion loss characteristics and shape factor can be improved.

DESCRIPTION OF THE PREFERRED EMBODIMENTS

First, parameters that are used in this description are described.

Figure 3:
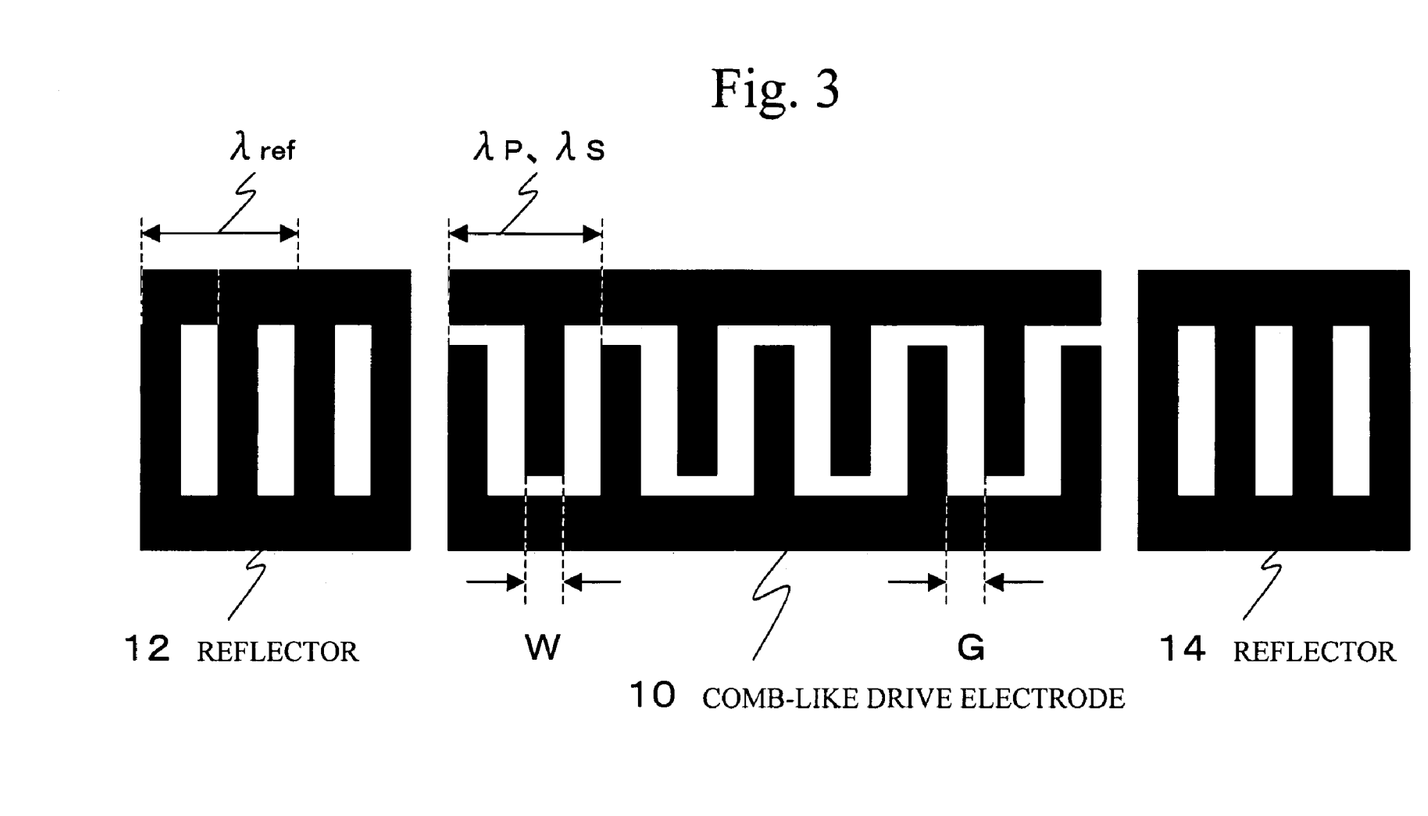
FIG. 3 shows a part of the parameters in a resonator.

FIG. 3 shows a part of the parameters relating to each resonator. In FIG. 3, the IDT pitches $\lambda_P$ and $\lambda_S$ each corresponds to the distance between each two electrode fingers extending from the same side (i.e., from the same bus bar). The width W is the width of each electrode finger. In this description, the width W is also referred to as the IDT pattern width. The gap G is the distance between each two neighboring electrode fingers. In this description, the gap G is also referred to as the IDT gap. The pitch of each reflection electrode (also referred to as the reflection electrode pitch) denoted by $\lambda_{ref}$ represents the distance between every two electrode fingers that sandwich one electrode finger. In this description, the IDT pitches $\lambda_P$ and $\lambda_S$ is also denoted by $\lambda_{idt}$ where it is not necessary to specify whether the subject resonator is a parallel-arm resonator or a series-arm resonator.

As described earlier, the present invention provides a surface acoustic wave device that has surface acoustic wave resonators connected in a multi-stage ladder arrangement. In this surface acoustic wave device, the parallel-arm resonators have two or more kinds of comb-like drive electrode pitches (the IDT pitches), and the series-arm resonators have two or more kinds of comb-like drive electrode pitches (this condition will be hereinafter referred to as the first condition). Also, the pitch of each reflection electrode that is placed at either side of each corresponding comb-like drive electrode is different from the pitch of the corresponding comb-like drive electrode (this condition will be hereinafter referred to as the second condition). Furthermore, the parallel-arm resonators have two or more kinds of electrostatic capacitances, and the series-arm resonators have two or more kinds of electrostatic capacitances (this condition will be hereinafter referred to as the third condition).

Referring now to the surface acoustic wave device shown in FIG. 1, this structure is described in detail.

The surface acoustic wave device shown in FIG. 1 has four-stage surface acoustic wave resonators connected in a ladder arrangement. As the first condition is applied to this surface acoustic wave device, the parallel-arm resonators P1 through P3 have the IDT pitches $\lambda_{P1}$, $\lambda_{P2}$, and $\lambda_{P3}$, which are of two or more kinds, and the series-arm resonators S1 through S3 have the IDT pitches $\lambda_{S1}$, $\lambda_{S2}$, and $\lambda_{S3}$, which are of two or more kinds. Having two or more kinds of IDT pitches means that there are two or more different IDT pitch values. The first condition in the parallel-arm resonators P1 through P3 may take any of the following four patterns: $\lambda_{P1} \neq \lambda_{P2} = \lambda_{P3}$, $\lambda_{P1} = \lambda_{P2} \neq \lambda_{P3}$, $\lambda_{P1} = \lambda_{P3} \neq \lambda_{P2}$, and $\lambda_{P1} \neq \lambda_{P2} \neq \lambda_{P3}$. Likewise, the first condition in the series-arm resonators S1 through S3 may take any of the following four patterns: $\lambda_{S1} \neq \lambda_{S2} = \lambda_{S3}$, $\lambda_{S1} = \lambda_{S2} \neq \lambda_{S3}$, $\lambda_{S1} = \lambda_{S3} \neq \lambda_{S2}$, and $\lambda_{S1} \neq \lambda_{S2} \neq \lambda_{S3}$.

A change to an IDT pitch leads to a change in the frequency characteristics of the corresponding resonator. More specifically, if an IDT pitch is made longer, the frequency characteristics shift to the low frequency side. If an IDT pitch is made shorter, on the other hand, the frequency characteristics shift to the high frequency side. In the case where the relationship of the IDT pitches is expressed as $\lambda_{P1} = \lambda_{P2} = \lambda_{P3}$ as in the prior art, the frequency characteristics of the three parallel-arm resonators P1 through P3 are all the same. As a result, large spurious peaks appear due to bulk wave radiation. With two or more kinds of IDT pitches used in accordance with the first condition, however, two or more types of frequency characteristics are formed. Accordingly, bulk wave radiation can be scattered, and spurious peak can also be scattered and reduced. At the same time, impedance mismatching can also be reduced. Furthermore, a combination of the first condition and the third condition can dramatically improve filter characteristics, as is described later.

Next, the second condition is described in detail. As the second condition is applied to the surface acoustic wave device shown in FIG. 1, the pitch $\lambda_{ref}$ of each of the reflection electrodes 12 and 14 that are placed on both sides of each comb-like drive electrode 10 is different from the pitch $\lambda_{idt}$ of the comb-like drive electrode 10. Here, the reflection electrodes 12 and 14 have the same pitch $\lambda_{ref}$.

Figure 4:
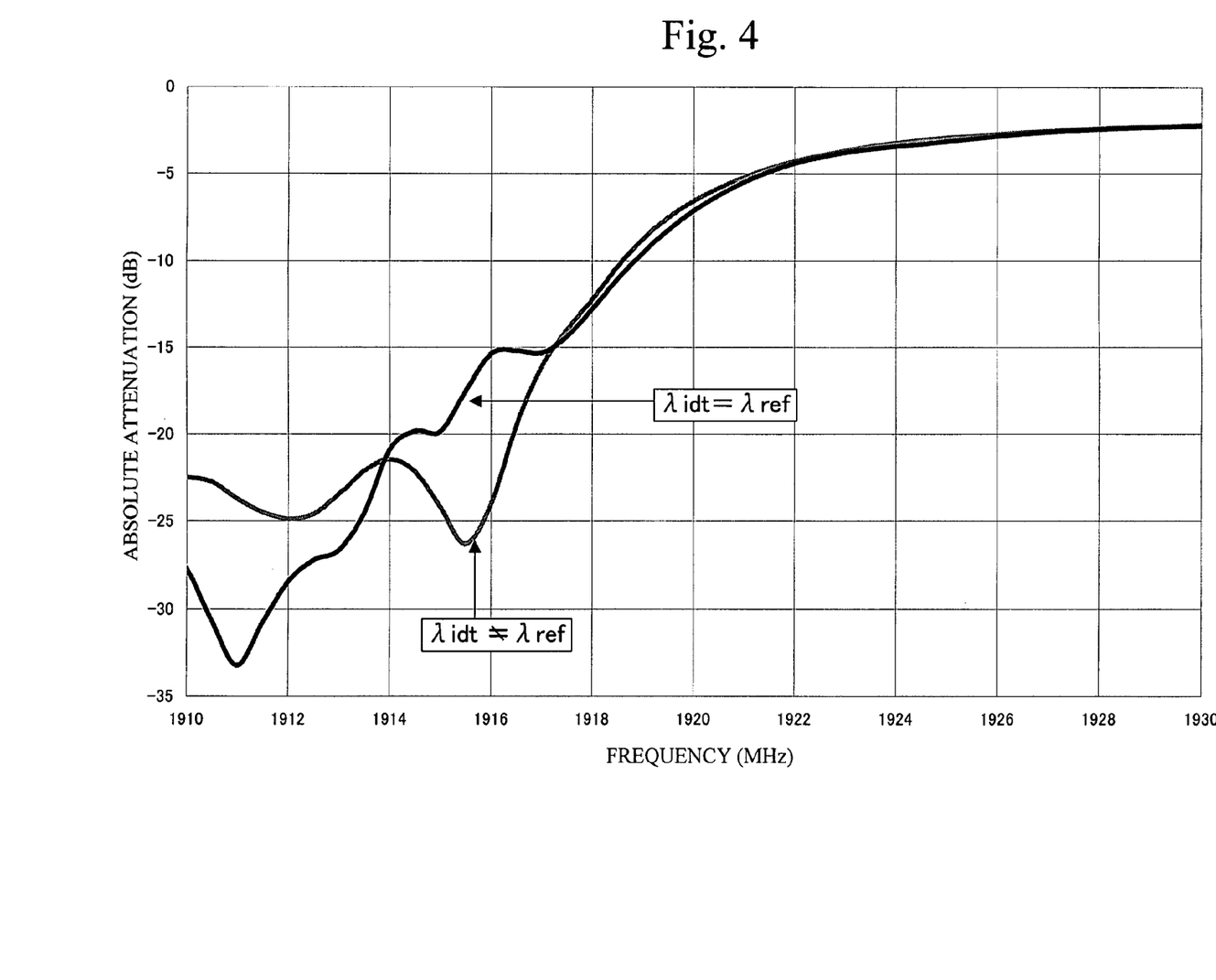
FIG. 4 shows the relationship between the pitch of a comb-like drive electrode and the pitch of reflection electrodes.

FIG. 4 is a graph showing the relationship between the pitch $\lambda_{idt}$ of the comb-like drive electrode 10 and the pitch $\lambda_{ref}$ of the reflection electrodes 12 and 14. FIG. 4 shows the resonator frequency characteristics obtained in the case where $\lambda_{idt} = \lambda_{ref}$, and the resonator frequency characteristics obtained in the case where $\lambda_{idt} \neq \lambda_{ref}$. In FIG. 4, the abscissa axis indicates frequency (MHz), and the ordinate axis indicates absolute attenuation (dB). In the case where $\lambda_{idt} \neq \lambda_{ref}$, spurious peaks near the pass band are smaller than in the case where $\lambda_{idt} = \lambda_{ref}$, and the positions of the spurious peaks are different from those in the case where $\lambda_{idt} = \lambda_{ref}$. Also, the shape factor in the case where $\lambda_{idt} \neq \lambda_{ref}$ is better than in the case where $\lambda_{idt} = \lambda_{ref}$.

Next, the third condition is described in detail. As the third condition is applied to the surface acoustic wave device shown in FIG. 1, the parallel-arm resonators P1 through P3 have the electrostatic capacitances $C_{P1}$, $C_{P2}$, and $C_{P3}$, which are of two or more kinds, and the series-arm resonators S1 through S3 have the electrostatic capacitances $C_{S1}$, $C_{S2}$, and $C_{S3}$, which are of two or more kinds. Having two or more kinds of electrostatic capacitances means that there are two or more different electrostatic capacitance values. The third condition in the parallel-arm resonators P1 through P3 may take any of the following four patterns: $C_{P1} \neq C_{P2} = C_{P3}$, $C_{P1} = C_{P2} \neq C_{P3}$, $C_{P1} = C_{P3} \neq C_{P2}$, and $C_{P1} \neq C_{P2} \neq C_{P3}$. Likewise, the third condition in the series-arm resonators S1 through S3 may take any of the following four patterns: $C_{S1} \neq C_{S2} = C_{S3}$, $C_{S1} = C_{S2} \neq C_{S3}$, $C_{S1} = C_{S3} \neq C_{S2}$, and $C_{S1} \neq C_{S2} \neq C_{S3}$. Although the parallel-arm resonator P2 and the series-arm resonator S3 are shared in operation, the "electrostatic capacitance" in the present invention is the electrostatic capacitance of each individual resonator, regardless of whether it is shared with another resonator.

The first and third conditions may be met by the same parallel-arm and series-arm resonators, or may be met by different parallel-arm and series-arm resonators.

Figure 5:
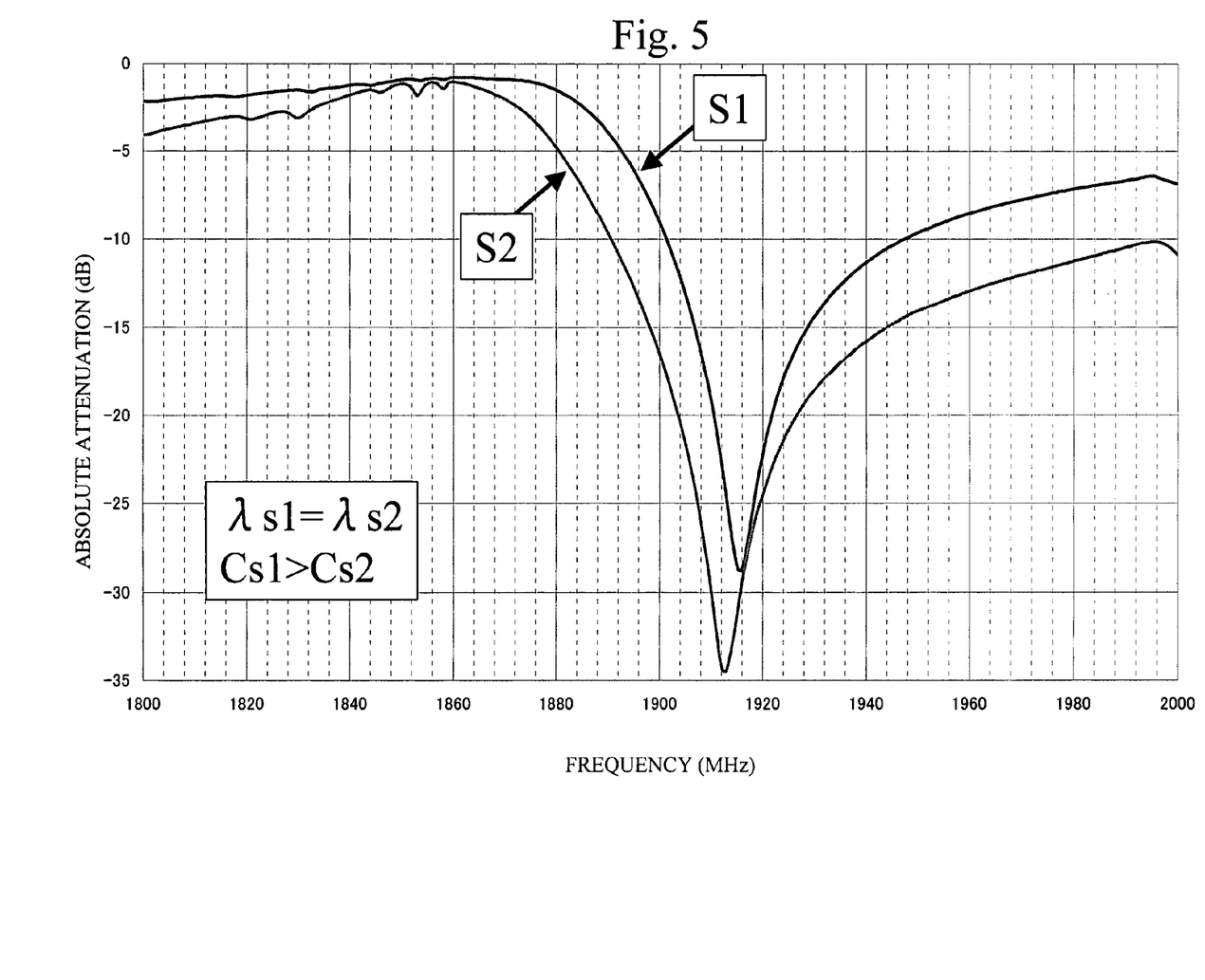
FIG. 5 shows the pass characteristics of two series-arm resonators.
Figure 6:
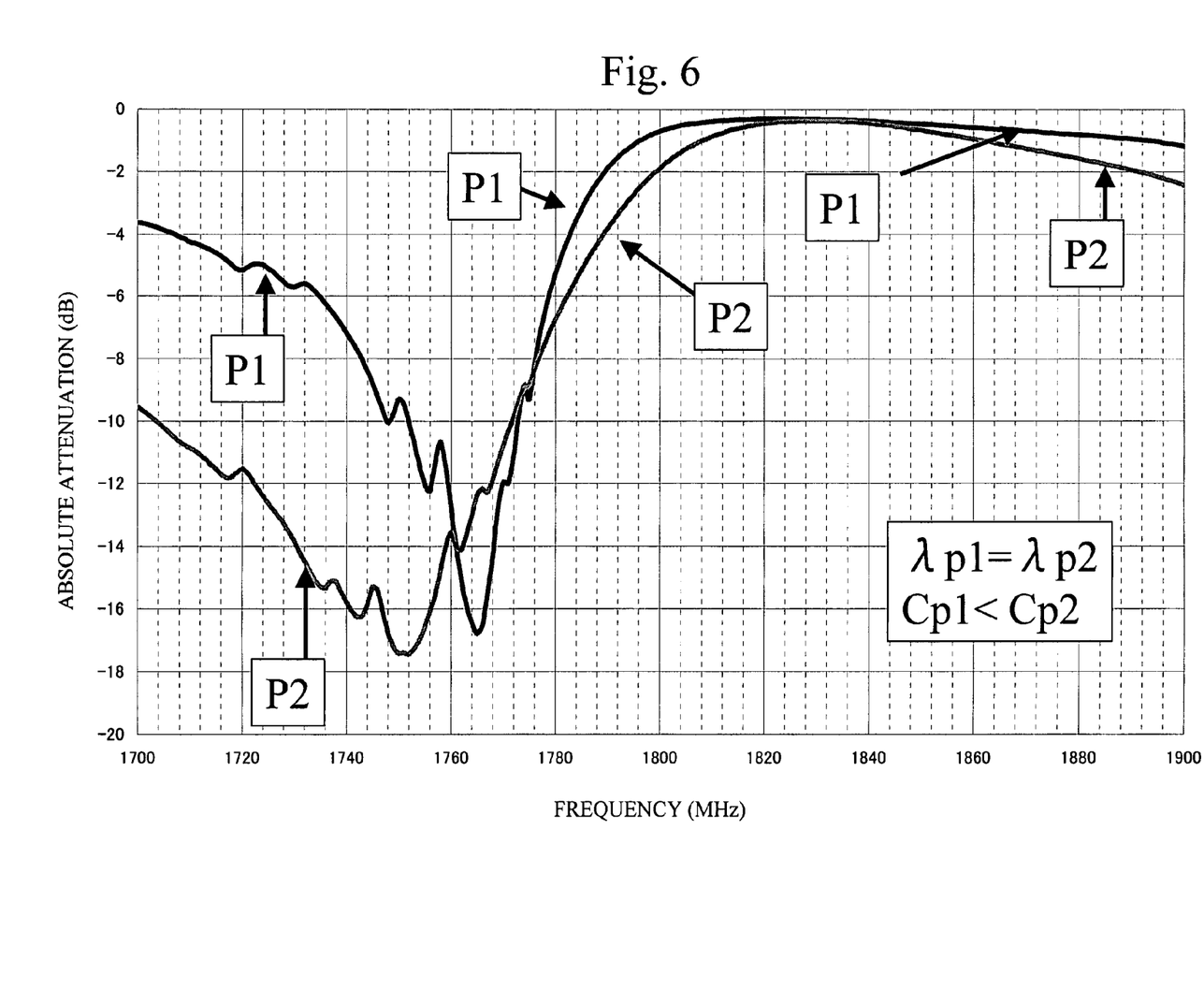
FIG. 6 shows the pass characteristics of two parallel-arm resonators.

FIG. 5 shows the pass characteristics of the series-arm resonators S1 and S2. In the case where $\lambda_{S1} = \lambda_{S2}$ and $C_{S1} > C_{S2}$, the frequencies at which the insertion loss becomes smallest are different from each other due to the difference in electrostatic capacitance. The frequency characteristic curve of the series-arm resonator S1 with the greater electrostatic capacitance $C_{S1}$ has the sharper cut-off profile. FIG. 6 shows the pass characteristics of the parallel-arm resonators P1 and P2. In the case where $\lambda_{P1} = \lambda_{P2}$ and $C_{P1} < C_{P2}$, the frequencies at which the insertion loss becomes smallest are different from each other due to the difference in electrostatic capacitance. The frequency characteristic curve of the parallel-arm resonator P1 with the smaller electrostatic capacitance $C_{P1}$ has the sharper cut-off profile.

Further, the insertion loss and the shape factor can be both improved by combining the first condition with the third condition. As described earlier, if an IDT pitch is made longer, the frequency characteristics shift to the low frequency side. If the IDT pitch is made shorter, the frequency characteristics shift to the high frequency side. In the case shown in FIG. 5, for example, the IDT pitch $\lambda_{S1}$ of the series-arm resonator S1 is made longer to match the frequency at which the insertion loss of the series-arm resonator S1 having the sharper cut-off profile (the frequency being hereinafter referred to as the peak frequency) with the peak frequency of the series-arm resonator S2. By doing so, the peak frequency of the series-arm resonator S1 shifts to the low frequency side, and the combined pass characteristics of the series-arm resonators S1 and S2 exhibit improvements in terms of insertion loss and shape factor. In the case shown in FIG. 6, for example, the IDT pitch $\lambda_{P1}$ of the parallel-arm resonator P1 is made shorter to match the peak frequency of the parallel-arm resonator P1 having the sharper cut-off profile with the peak frequency of the parallel-arm resonator P2. By doing so, the peak frequency of the parallel-arm resonator P1 shifts to the high frequency side, and the combined pass characteristics of the parallel-arm resonators P1 and P2 exhibit improvements in terms of insertion loss and shape factor.

Examples of preferred embodiments of the present invention include the following situations:

Among the parallel-arm resonators P1 through P3, the parallel-arm resonator (P2, for example) with the greatest electrostatic capacitance has the longest comb-like drive electrode pitch.

Among the series-arm resonators S1 through S3, the series-arm resonator (S3, for example) with the smallest electrostatic capacitance has the shortest comb-like drive electrode pitch.

Among the parallel-arm resonators P1 through P3, the parallel-arm resonator (P3, for example) with the shortest comb-like drive electrode pitch has the smallest electrostatic capacitance.

Among the series-arm resonators S1 through S3, the series-arm resonator (S1, for example) with the longest comb-like drive electrode pitch has the greatest electrostatic capacitance.

Where the electrostatic capacitances of any two parallel-arm resonators among the parallel-arm resonators P1 through P3 (P1 and P2, P2 and P3, or P1 and P3) are represented by $C_{pa}$ and $C_{pb}$ and the corresponding comb-like drive electrode pitches are represented by $\lambda_{pa}$ and $\lambda_{pb}$, if $C_{pa}$ is greater than $C_{pb}$, $\lambda_{pa}$ is longer than $\lambda_{pb}$.

Where the electrostatic capacitances of any two series-arm resonators among the series-arm resonators S1 through S3 (S1 and S2, S2 and S3, or S1 and S3) are represented by $C_{sa}$ and $C_{sb}$ and the corresponding comb-like drive electrode pitches are represented by $\lambda_{sa}$ and $\lambda_{sb}$, if $C_{sa}$ is greater than $C_{sb}$, $\lambda_{sa}$ is a is longer than $\lambda_{sb}$.

Since each electrostatic capacitance is determined by the aperture length L and the number of pairs of drive electrode fingers, a parallel-arm resonator having a different comb-like drive electrode pitch among the parallel-arm resonators P1 through P3 has at least a different aperture length or a different number of drive electrode finger pairs from the other parallel-arm resonators. Such a parallel-arm resonator may of course be different from the other parallel-arm resonators both in the aperture length and the number of drive electrode finger pairs. Likewise, a series-arm resonator having a different comb-like drive electrode pitch among the series-arm resonators S1 through S3 has at least a different aperture length or a different number of drive electrode finger pairs from the other series-arm resonators. Such a series-arm resonator may of course be different from the other series-arm resonators both in the aperture length and the number of drive electrode finger pairs.

Further, as each electrostatic capacitance depends on the ratio of the width of each comb-like drive electrode finger to the gap between each neighboring comb-like drive electrode fingers, a parallel-arm resonator having a different comb-like drive electrode pitch among the parallel-arm resonators P1 through P3 has a different ratio of the width of each comb-like drive electrode finger to the gap between each two neighboring comb-like electrode fingers from the other parallel-arm resonators. Likewise, a series-arm resonator having a different comb-like drive electrode pitch among the series-arm resonators S1 through S3 has a different ratio of the width of each comb-like drive electrode finger to the gap between each two neighboring comb-like electrode fingers from the other series-arm resonators.

Surface acoustic wave devices having surface acoustic wave resonators connected in a multi-stage ladder arrangement of the present invention are not limited to the surface acoustic wave device shown in FIG. 1, and the present invention provides other various types of ladder-type surface acoustic wave devices. For example, the series-arm resonator S3 shown in FIG. 1 is shared between the third and fourth stages, but may be provided separately as in the first and second stages. On the other hand, it is also possible to employ a combined series-arm resonator of the series-arm resonators S1 and S2 of the first and second stages. Further, a single series-arm resonator may be employed in each stage. The parallel-arm resonator P2 may also be formed with two parallel-arm resonators. Although the second-stage parallel-arm resonator P2 is located in a later stage than the second-stage series-arm resonator S2 in FIG. 1, it may be located in an earlier stage than the series-arm resonator S2. In such a case, each of the parallel-arm resonators is not shared between two or more stages. Further, the first stage may be modified by placing the parallel-arm resonator P1 in a stage later than the series-arm resonator S1. Also, the number of stages is not limited to four, and the present invention includes ladder-type surface acoustic wave devices with two or more stages.

The following is a detailed description of embodiments of the present invention.

(First Embodiment)

Figure 7:
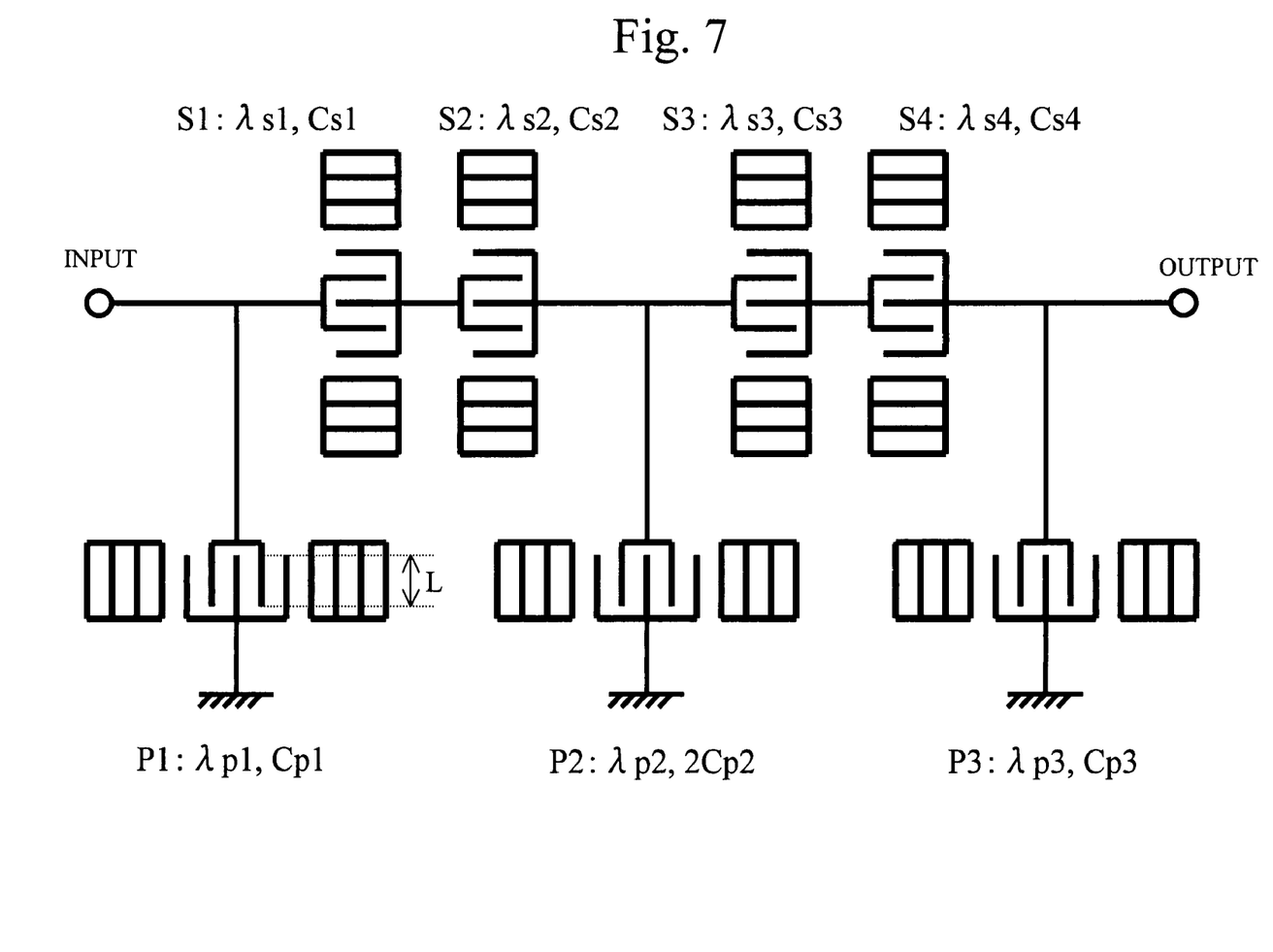
FIG. 7 illustrates a surface acoustic wave device in accordance with a first embodiment of the present invention.

A first embodiment of the present invention is as follows. As shown in FIG. 7, a ladder filter having resonators P1-S1-S2-P2-S3-S4-P3 connected in this order is formed with Al alloy on a piezoelectric substrate of 42° Y—X LiTaO$_3$, so as to cope with a PCS reception filter (with a pass band of 1930 through 1990 MHz and an attenuation (transmission) band of 1850 through 1910 MHz). The parallel-arm resonator P1 has an IDT pitch $\lambda_{P1}$ of 2.024 μm, a reflection electrode pitch $\lambda_{refP1}$ of 2.044 μm, an aperture length $L_{P1}$ of 54.6 μm, and 20 pairs ($N_{P1}$) of drive electrode fingers. The parallel-arm resonator P2 has an IDT pitch $\lambda_{P2}$ of 2.043 μm, a reflection electrode pitch $\lambda_{refP2}$ of 2.063 μm, an aperture length $L_{P2}$ of 83.8 μm, and 72 pairs ($N_{P2}$) of drive electrode fingers. The parallel-arm resonator P3 has an IDT pitch $\lambda_{P3}$ of 2.018 μm, a reflection electrode pitch $\lambda_{refP3}$ of 2.038 μm, an aperture length $L_{P3}$ of 54.5 μm, and 20 pairs ($N_{P3}$) of drive electrode fingers. The series-arm resonators S1 and S4 each has an IDT pitch ($\lambda_{S1}=\lambda_{S4}$) of 1.941 μm, a reflection electrode pitch ($\lambda_{refS1}=\lambda_{refS4}$) of 1.931 μm, an aperture length ($L_{S1}=L_{S4}$) of 25.2 μm, and 121 pairs ($N_{S1}=N_{S4}$) of drive electrode fingers. The series-arm resonators S2 and S3 each has an IDT pitch ($\lambda_{S2}=\lambda_{S3}$) of 1.969 μm, a reflection electrode pitch ($\lambda_{refS2}=\lambda_{refS3}$) of 1.964 μm, an aperture length ($L_{S2}=L_{S3}$) of 25.6 μm, and 123 pairs ($N_{S2}=N_{S3}$) of drive electrode fingers. Each of the resonators is designed so that the ratio W/G of the IDT pattern width W to the IDT gap G becomes 1.5.

In the filter shown in FIG. 7, the relationship among the electrostatic capacitances is expressed as $C_{P1} \neq C_{P2} \neq C_{P3} \neq C_{S1}=C_{S4} \neq C_{S2}=C_{S3}$, and the relationship among the IDT pitches is expressed as $\lambda_{P1} \neq \lambda_{P2} \neq \lambda_{P3} \neq \lambda_{S1}=\lambda_{S4} \neq \lambda_{S2}=\lambda_{S3}$. The IDT pitches are different from the reflection electrode pitches. In FIG. 7, the reflectors of each resonator are not connected to the ground GND, but may have a GND potential.

Figure 8:
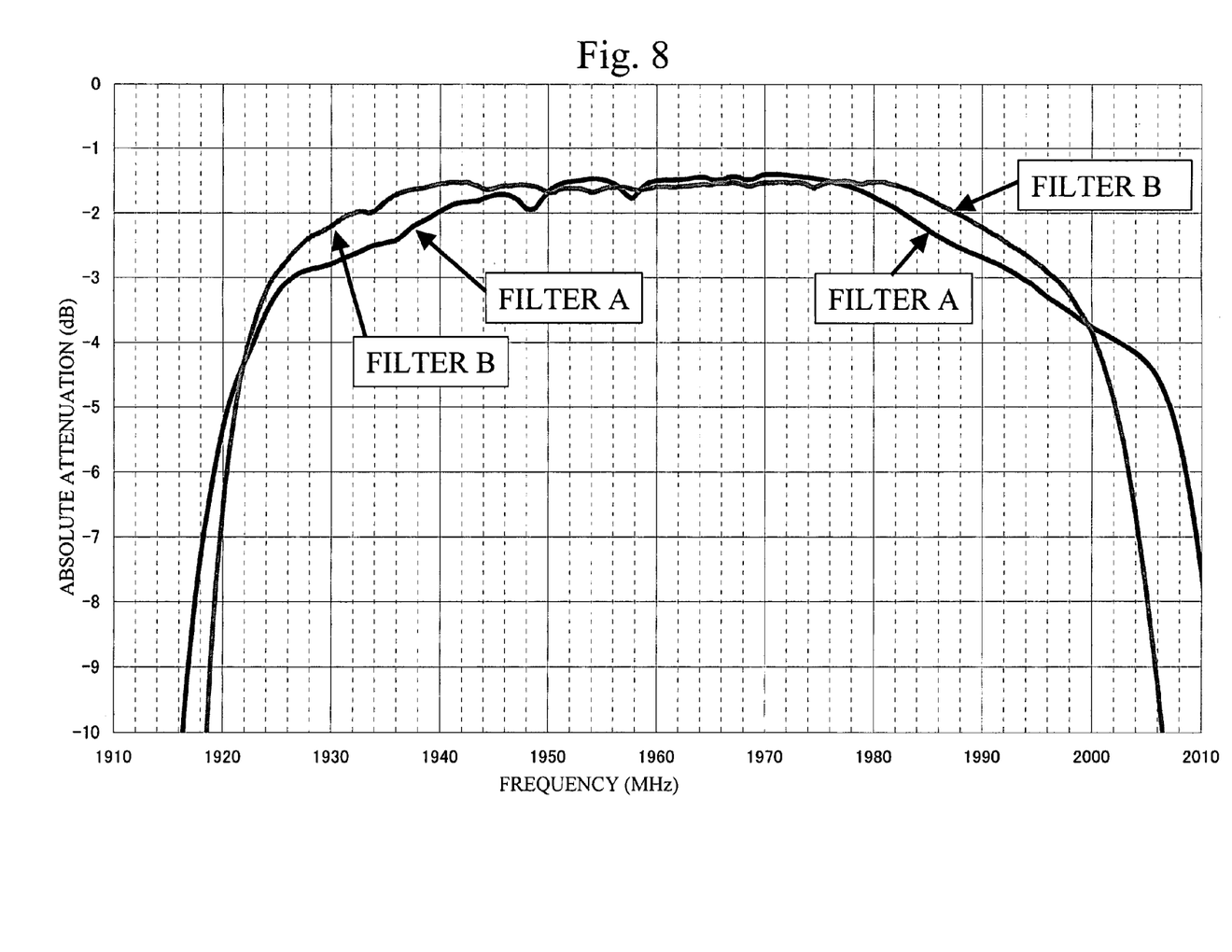
FIG. 8 shows the filter characteristics of a comparative example and the first embodiment.

FIG. 8 shows the characteristics of a comparative example (Filter A) and the characteristics of this embodiment (Filter B). As can be seen from FIG. 8, this embodiment is greatly improved in terms of insertion loss and shape factor. The same effects as this can also be achieved in the case where the electrostatic capacitances and the IDT pitches are varied to meet the above described conditions that the IDT pitch $\lambda_{pa}$ is longer than the IDT pitch $\lambda_{pb}$ when the electrostatic capacitance $C_{pa}$ is greater than the electrostatic capacitance $C_{pb}$ and/or the IDT pitch $\lambda_{sa}$ is longer than the IDT pitch $\lambda_{sb}$ when the electrostatic capacitance $C_{sa}$ is greater than the electrostatic capacitance $C_{sb}$.

(Second Embodiment)

This embodiment is a filter with the same structure as the structure shown in FIG. 1. In this filter, the parallel-arm resonator P2 with the greatest electrostatic capacitance among the parallel-arm resonators P1 through P3 has the longest IDT pitch. The parallel-arm resonator P1 has an IDT pitch $\lambda_{P1}$ of 2.032 μm, a reflection electrode pitch $\lambda_{refP1}$ of 2.052 μm, an aperture length $L_{P1}$ of 54.9 μm, and 42 pairs ($N_{P1}$) of drive electrode fingers. The parallel-arm resonator P2 has an IDT pitch $\lambda_{P2}$ of 2.040 μm, a reflection electrode pitch $\lambda_{refP2}$ of 2.060 μm, an aperture length $L_{P2}$ of 84.3 μm, and 84 pairs ($N_{P2}$) of drive electrode fingers. The parallel-arm resonator P3 has an IDT pitch $\lambda_{P3}$ of 2.032 μm, a reflection electrode pitch $\lambda_{refP3}$ of 2.052 μm, an aperture length $L_{P3}$ of 54.9 μm, and 40 pairs ($N_{P3}$) of drive electrode fingers. The series-arm resonators S1 and S2 each has an IDT pitch ($\lambda_{S1}=\lambda_{S2}$) of 1.952 μm, a reflection electrode pitch ($\lambda_{refS1}=\lambda_{refS2}$) of 1.947 μm, an aperture length ($L_{S1}=L_{S2}$) of 25.0 μm, and 132 pairs ($N_{S1}=N_{S2}$) of drive electrode fingers. The series-arm resonator S3 has an IDT pitch $\lambda_{S3}$ of 1.952 μm, a reflection electrode pitch $\lambda_{refS3}$ of 1.947 μm, an aperture length $L_{S3}$ of 25.0 μm, and 66 pairs ($N_{S3}$) of drive electrode fingers. Each of the resonators is designed so that the ratio W/G becomes 1.5.

Figure 9:
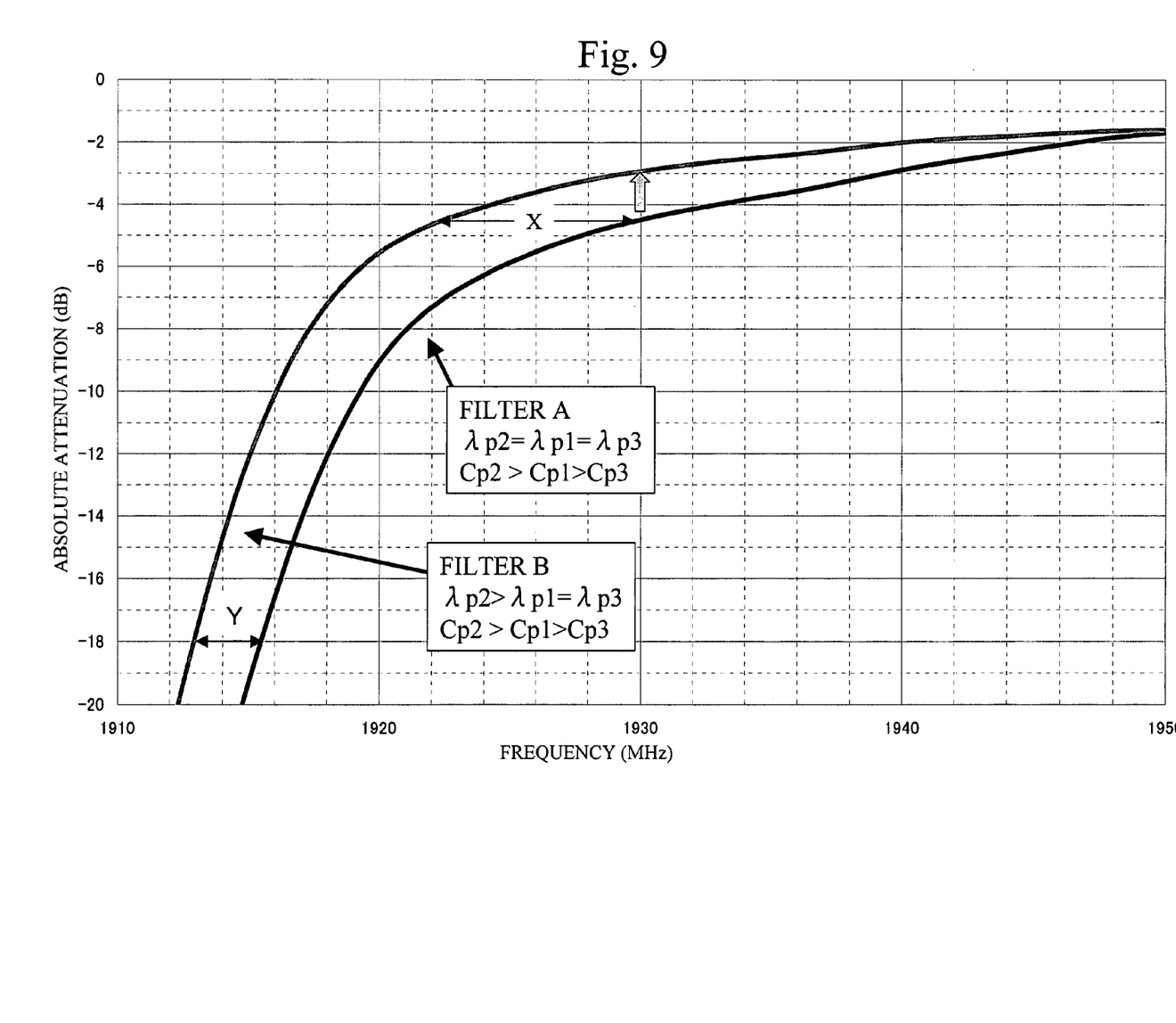
FIG. 9 shows the filter characteristics of a comparative example and a second embodiment of the present invention.

FIG. 9 shows the pass characteristics comparison between a comparative example (Filter A) and this embodiment (Filter B). The insertion loss at the low-frequency edge of the pass band is greatly reduced by giving the longest IDT pitch to the parallel-arm resonator P2 with the greatest electrostatic capacitance. Since the difference X–Y between the frequency variation X of the insertion loss on the low frequency side and the frequency variation Y of the transmission band attenuation obtained after the change of $\lambda_{P2}$ is greater than 0, the shape factor is also improved. Here, the difference between the IDT pitch $\lambda_{P1}(\lambda_{P3})$ and the IDT pitch $\lambda_{P2}$, and each electrostatic capacitance can be arbitrarily varied, depending on the required filter characteristics. Also, the IDT pitches $\lambda_{P1}$ and $\lambda_{P3}$ may not be equal to each other.

(Third Embodiment)

This embodiment is a filter with the same structure as the structure shown in FIG. 1. In this filter, the parallel-arm resonator P3 with the shortest IDT pitch among the parallel-arm resonators P1 through P3 has the smallest electrostatic capacitance. The parallel-arm resonator P1 has an IDT pitch $\lambda_{P1}$ of 2.032 μm, a reflection electrode pitch $\lambda_{refP1}$ of 2.052 μm, an aperture length $L_{P1}$ of 54.9 μm, and 42 pairs ($N_{P1}$) of drive electrode fingers. The parallel-arm resonator P2 has an IDT pitch $\lambda_{P2}$ of 2.032 μm, a reflection electrode pitch $\lambda_{refP2}$ of 2.052 μm, an aperture length $L_{P2}$ of 84.0 μm, and 84 pairs ($N_{P2}$) of drive electrode fingers. The parallel-arm resonator P3 has an IDT pitch $\lambda_{P3}$ of 2.022 μm, a reflection electrode pitch $\lambda_{refP3}$ of 2.042 μm, an aperture length $L_{P3}$ of 54.6 μm, and 40 pairs ($N_{P3}$) of drive electrode fingers. The series-arm resonators S1 and S2 each has an IDT pitch ($\lambda_{S1}=\lambda_{S2}$) of 1.952 μm, a reflection electrode pitch ($\lambda_{refS1}=\lambda_{refS2}$) of 1.947 μm, an aperture length ($L_{S1}=L_{S2}$) of 25.0 μm, and 132 pairs ($N_{S1}=N_{S2}$) of drive electrode fingers. The series-arm resonator S3 has an IDT pitch $\lambda_{S3}$ of 1.952 μm, a reflection electrode pitch $\lambda_{refS3}$ of 1.947 μm, an aperture length $L_{S3}$ of 25.0 μm, and 66 pairs ($N_{S3}$) of drive electrode fingers. Each of the resonators is designed so that the ratio W/G becomes 1.5.

Figure 10:
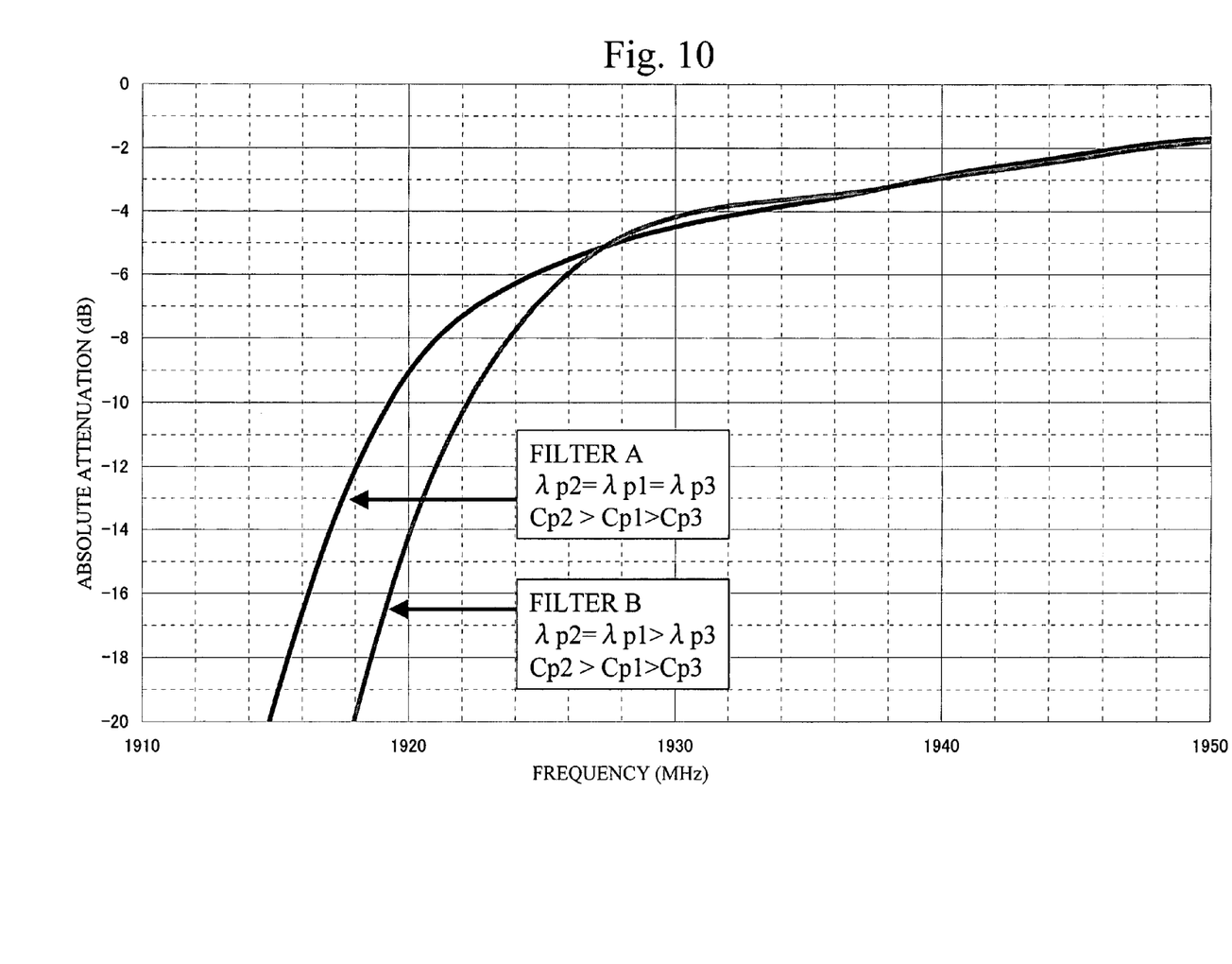
FIG. 10 shows the filter characteristics of a comparative example and a third embodiment of the present invention.

FIG. 10 shows the pass characteristics comparison between a comparative example (Filter A) and this embodiment (Filter B). The insertion loss and the shape factor at the low-frequency edge of the pass band are improved by giving the shortest IDT pitch to the parallel-arm resonator P3 with the smallest electrostatic capacitance. Here, the difference between the IDT pitch $\lambda_{P2}(\lambda_{P3})$ and the IDT pitch $\lambda_{P1}$, and each electrostatic capacitance can be arbitrarily varied, depending on the required filter characteristics. Also, the IDT pitches $\lambda_{P1}$ and $\lambda_{P2}$ may not be equal to each other.

Furthermore, the same effects as the above can be achieved when the relationship among the IDT pitches is expressed as $\lambda_{P2} > \lambda_{P1} > \lambda_{P3}$.

(Fourth Embodiment)

This embodiment is a filter with the same structure as the structure shown in FIG. 1. In this filter, the series-arm resonator S3 with the smallest electrostatic capacitance among the series-arm resonators S1 through S3 has the shortest IDT pitch. The parallel-arm resonator P1 has an IDT pitch $\lambda_{P1}$ of 2.030 μm, a reflection electrode pitch $\lambda_{refP1}$ of 2.050 μm, an aperture length $L_{P1}$ of 52.0 μm, and 23 pairs ($N_{P1}$) of drive electrode fingers. The parallel-arm resonator P2 has an IDT pitch $\lambda_{P2}$ of 2.060 μm, a reflection electrode pitch $\lambda_{refP2}$ of 2.080 μm, an aperture length $L_{P2}$ of 83.3 μm, and 76 pairs ($N_{P2}$) of drive electrode fingers. The parallel-arm resonator P3 has an IDT pitch $\lambda_{P3}$ of 2.020 μm, a reflection electrode pitch $\lambda_{refP3}$ of 2.040 μm, an aperture length $L_{P3}$ of 52.0 μm, and 20 pairs ($N_{P3}$) of drive electrode fingers. The series-arm resonator S1 has an IDT pitch $\lambda_{S1}$ of 1.972 μm, a reflection electrode pitch $\lambda_{refS1}$ of 1.967 μm, an aperture length $L_{S1}$ of 30.0 μm, and 190 pairs ($N_{S1}$) of drive electrode fingers. The series-arm resonator S2 has an IDT pitch $\lambda_{S2}$ of 1.972 μm, a reflection electrode pitch $\lambda_{refS2}$ of 1.967 μm, an aperture length $L_{S2}$ of 31.0 μm, and 123 pairs ($N_{S2}$) of drive electrode fingers. The series-arm resonator S3 has an IDT pitch $\lambda_{S3}$ of 1.962 μm, a reflection electrode pitch $\lambda_{refS3}$ of 1.952 μm, an aperture length $L_{S3}$ of 30.0 μm, and 76 pairs ($N_{S3}$) of drive electrode fingers. Each of the resonators is designed so that the ratio W/G becomes 1.5.

Figure 11:
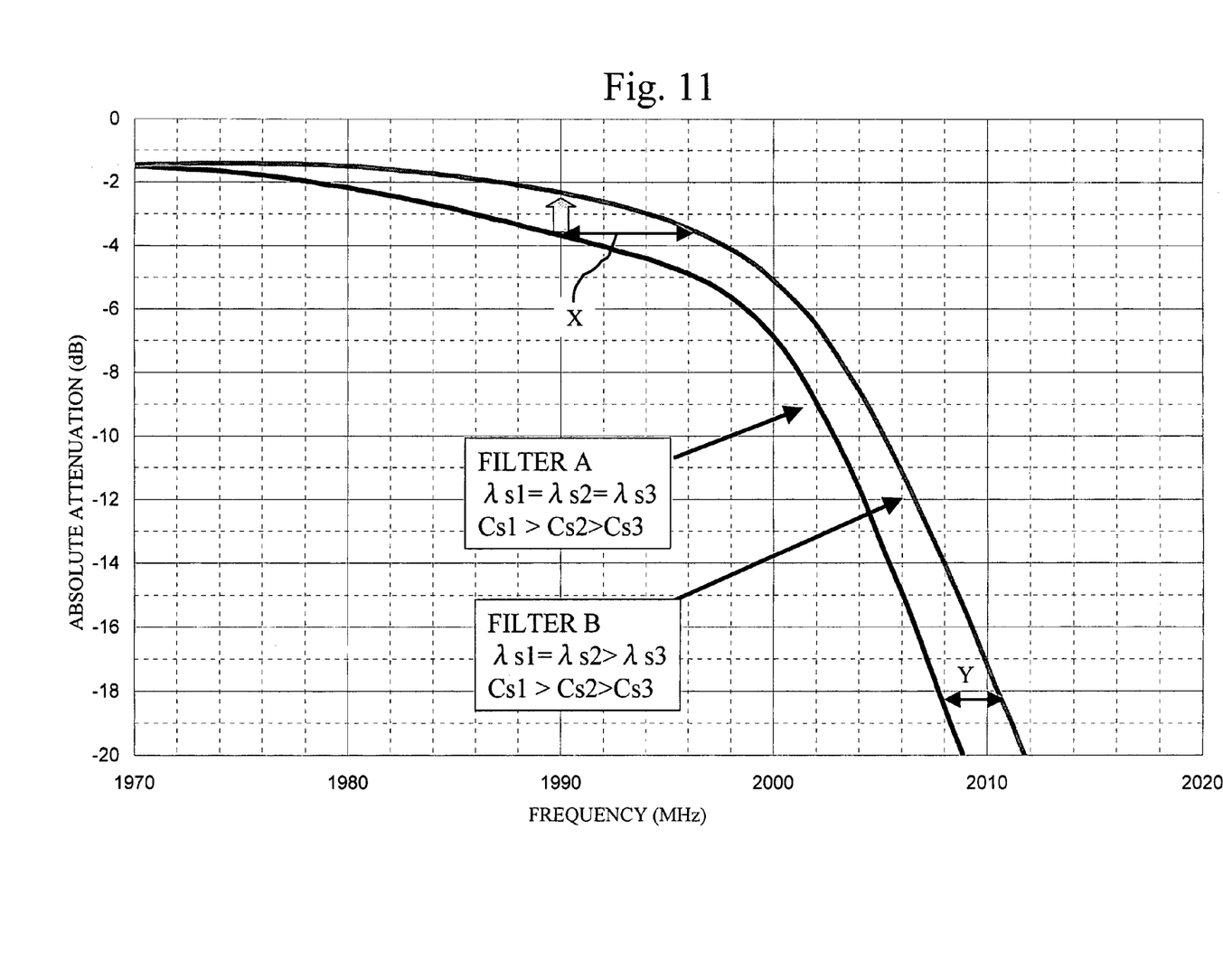
FIG. 11 shows the filter characteristics of a comparative example and a fourth embodiment of the present invention.

FIG. 11 shows the pass characteristics comparison between a comparative example (Filter A) and this embodiment (Filter B). The insertion loss at the high-frequency edge of the pass band is greatly reduced by giving the shortest IDT pitch to the series-arm resonator S3 with the smallest electrostatic capacitance. Since the difference X–Y between the frequency variation X the insertion loss on the high frequency side and the frequency variation Y of the attenuation on the high frequency side of the pass band obtained after the change of $\lambda_{S3}$ is greater than 0, the shape factor is also improved. Here, the difference between the IDT pitch $\lambda_{S3}$ and the IDT pitch $\lambda_{S1}(\lambda_{S2})$, and each electrostatic capacitance can be arbitrarily varied, depending on the required filter characteristics. Also, the IDT pitches $\lambda_{S1}$ and $\lambda_{S2}$ may not be equal to each other.

(Fifth Embodiment)

This embodiment is a filter with the same structure as the structure shown in FIG. 1. In this filter, the series-arm resonator S1 with the longest IDT pitch among the series-arm resonators S1 through S3 has the greatest electrostatic capacitance. The parallel-arm resonator P1 has an IDT pitch $\lambda_{P1}$ of 2.030 μm, a reflection electrode pitch $\lambda_{refP1}$ of 2.050 μm, an aperture length $L_{P1}$ of 52.0 μm, and 23 pairs ($N_{P1}$) of drive electrode fingers. The parallel-arm resonator P2 has an IDT pitch $\lambda_{P2}$ of 2.060 μm, a reflection electrode pitch $\lambda_{refP2}$ of 2.080 μm, an aperture length $L_{P2}$ of 83.3 μm, and 76 pairs ($N_{P2}$) of drive electrode fingers. The parallel-arm resonator P3 has an IDT pitch $\lambda_{P3}$ of 2.020 μm, a reflection electrode pitch $\lambda_{refP3}$ of 2.040 μm, an aperture length $L_{P3}$ of 52.0 μm, and 20 pairs ($N_{P3}$) of drive electrode fingers. The series-arm resonator S1 has an IDT pitch $\lambda_{S1}$ of 2.012 μm, a reflection electrode pitch $\lambda_{refS1}$ of 2.007 μm, an aperture length $L_{S1}$ of 30.4 μm, and 190 pairs ($N_{S1}$) of drive electrode fingers. The series-arm resonator S2 has an IDT pitch $\lambda_{S2}$ of 1.972 μm, a reflection electrode pitch $\lambda_{refS2}$ of 1.962 μm, an aperture length $L_{S2}$ of 31.0 μm, and 123 pairs ($N_{S2}$) of drive electrode fingers. The series-arm resonator S3 has an IDT pitch $\lambda_{S3}$ of 1.972 μm, a reflection electrode pitch $\lambda_{refS3}$ of 1.962 μm, an aperture length $L_{S3}$ of 30.0 μm, and 76 pairs ($N_{S3}$) of drive electrode fingers. Each of the resonators is designed so that the ratio W/G becomes 1.5.

Figure 12:
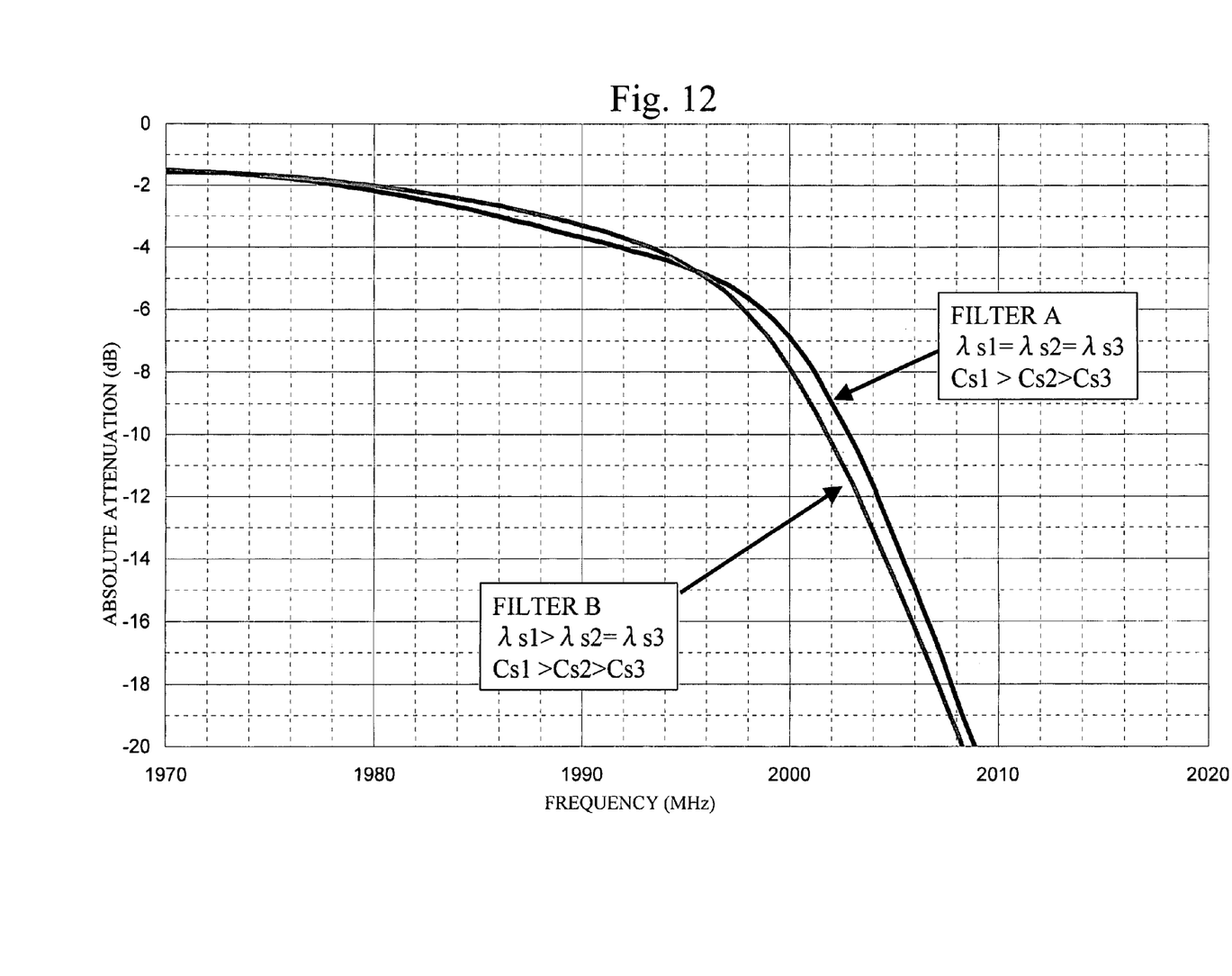
FIG. 12 shows the filter characteristics of a comparative example and a fifth embodiment of the present invention.

FIG. 12 shows the pass characteristics comparison between a comparative example (Filter A) and this embodiment (Filter B). The insertion loss and the shape factor at the high-frequency edge of the pass band are improved by giving the longest IDT pitch to the series-arm resonator S1 with the greatest electrostatic capacitance. Here, the difference between the IDT cycle $\lambda_{S1}$ and the IDT pitch $\lambda_{S2}$ ($\lambda_{S3}$), and each electrostatic capacitance can be arbitrarily varied, depending on the required filter characteristics. Also, the IDT pitches $\lambda_{S2}$ and $\lambda_{S3}$ may not be equal to each other. Furthermore, the same effects as the above can be achieved when the relationship among the IDT pitches is expressed as $\lambda_{S3} < \lambda_{S2} < \lambda_{S1}$.

In each of the foregoing embodiments, the electrostatic capacitance of each resonator is adjusted by varying the aperture length L and the number N of electrode finger pairs. However, it is also possible to adjust the electrostatic capacitance by changing the ratio W/G of the IDT pattern width W to the IDT gap G (the electrostatic capacitance can be made smaller by lowering the ratio W/G). Alternatively, the aperture length L and the number N of electrode finger pairs as well as the ratio W/G of the IDT pattern width W to the IDT gap G can be varied to adjust the electrostatic capacitance.

Figure 13:
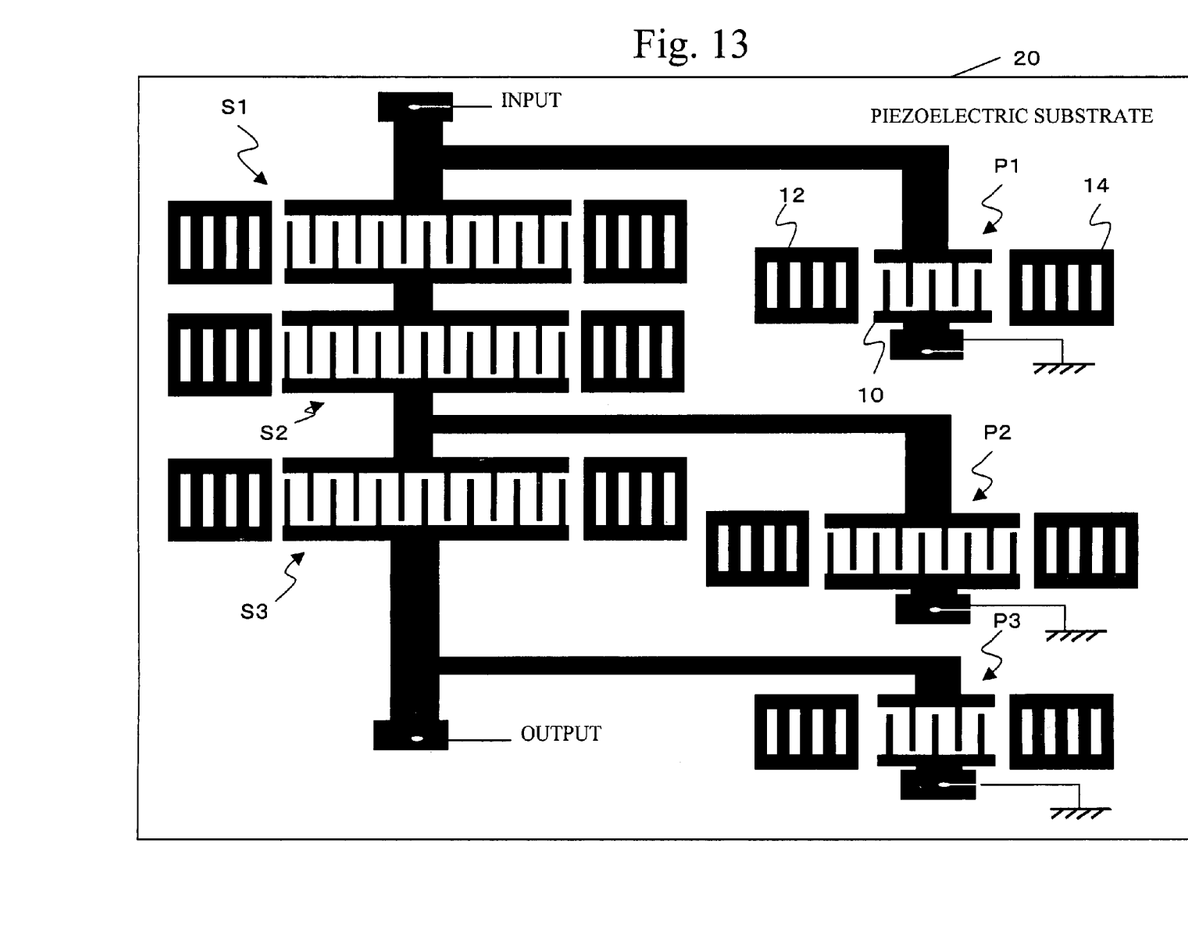
FIG. 13 illustrates another embodiment of a surface acoustic wave device in accordance with the present invention.

FIG. 13 is a plan view of an example structure of a surface acoustic wave device in accordance with the present invention. Al-alloy electrodes are formed on a piezoelectric substrate 20 of 42° Y-cut X-propagation LiTaO$_3$. The same effects can be achieved with other piezoelectric substrates or other electrode materials, of course. FIG. 13 merely illustrates a surface acoustic wave device having the electrodes of series-arm resonators S1 through S3 and the electrodes of parallel-arm resonators P1 through P3 formed on the single piezoelectric substrate 20, and does not specifically show the electrode pattern that meet the above described conditions.

The present invention has been described so far by way of examples with reference to the accompanying drawings. However, the present invention is not limited to the above-described embodiments and examples, and various changes and modifications may be made without departing from the scope of the invention.

As described above, the present invention can provide a surface acoustic wave device that has resonators connected in multi-stage ladder arrangement, and exhibits improved insertion loss characteristics and an improved shape factor.

What is claimed is:

1. A surface acoustic wave device that has surface acoustic wave resonators connected in a multi-stage ladder arrangement, comprising: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators wherein, among the parallel-arm resonators, the parallel-arm resonator with the greatest electrostatic capacitance has the longest comb-like drive electrode pitch.

2. A surface acoustic wave device that has surface acoustic wave resonators connected in a multi-stage ladder arrangement, comprising: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators wherein, among the series-arm resonators, the series-arm resonator with the smallest electrostatic capacitance has the shortest comb-like drive electrode pitch.

3. A surface acoustic wave device that has surface acoustic wave resonators connected in a multi-stage ladder arrangement, comprising: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators wherein, among the parallel-arm resonators, the parallel-arm resonator with the shortest comb-like drive electrode pitch has the smallest electrostatic capacitance.

4. A surface acoustic wave device that has surface acoustic wave resonators connected in a multi-stage ladder arrangement, comprising: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators wherein, among the series-arm resonators, the series-arm resonator with the longest comb-like drive electrode pitch has the greatest electrostatic capacitance.

5. A surface acoustic wave device that has surface acoustic wave resonators connected in a multi-stage ladder arrangement, comprising: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators wherein, among the parallel-arm resonators, a parallel-arm resonator having a different comb-like drive electrode pitch from the other parallel-arm resonators is also different in the ratio of the width of each comb-like drive electrode finger to the gap between each two neighboring electrode fingers.

6. A surface acoustic wave device that has surface acoustic wave resonators connected in a multi-stage ladder arrangement, comprising: two or more different comb-like drive electrode pitches of parallel-arm resonators and two or more different comb-like drive electrode pitches of series-arm resonators; reflection electrodes placed at either side of a comb-like drive electrode having a pitch different from that of said comb-like drive electrode; and two or more different electrostatic capacitances of parallel-arm resonators and two or more different electrostatic capacitances of series-arm resonators wherein, among the series-arm resonators, a series-arm resonator having a different comb-like drive electrode pitch from the other series-arm resonators is also different in the ratio of the width of each comb-like drive electrode finger to the gap between each two neighboring electrode fingers.

* * * * *